US010992311B2

(12) United States Patent
Miyahara

(10) Patent No.: US 10,992,311 B2
(45) Date of Patent: *Apr. 27, 2021

(54) DELTA-SIGMA AD CONVERTER AND DELTA-SIGMA AD CONVERTING METHOD

(71) Applicant: Asahi Kasei Microdevices Corporation, Tokyo (JP)

(72) Inventor: Yuichi Miyahara, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/924,196

(22) Filed: Jul. 9, 2020

(65) Prior Publication Data

US 2020/0343906 A1    Oct. 29, 2020

Related U.S. Application Data

(63) Continuation of application No. 16/438,491, filed on Jun. 12, 2019, now Pat. No. 10,720,939.

(30) Foreign Application Priority Data

Jun. 12, 2018 (JP) .............................. JP2018-112335
Apr. 19, 2019 (JP) .............................. JP2019-080476

(51) Int. Cl.
*H03M 3/00* (2006.01)
(52) U.S. Cl.
CPC ........... *H03M 3/496* (2013.01); *H03M 3/464* (2013.01)
(58) Field of Classification Search
CPC ............................. H03M 3/464; H03M 3/496

USPC .................................................. 341/140–155
See application file for complete search history.

(56) References Cited

U.S. PATENT DOCUMENTS

| | | | | |
|---|---|---|---|---|
| 6,697,493 B1* | 2/2004 | Kern | ...................... | H04R 1/005 381/111 |
| 7,215,270 B1 | 5/2007 | Kozak | | |
| 8,604,848 B1* | 12/2013 | Chen | ..................... | H03L 7/1974 327/156 |
| 10,284,222 B1* | 5/2019 | Gupta | ................... | H03M 3/494 |
| 10,720,939 B2* | 7/2020 | Miyahara | .............. | H03M 3/496 |
| 2005/0143032 A1* | 6/2005 | Matsushita | ........... | H03D 3/008 455/232.1 |
| 2006/0187199 A1* | 8/2006 | Lieberman | ........... | G06F 3/0421 345/156 |

(Continued)

FOREIGN PATENT DOCUMENTS

| | | |
|---|---|---|
| JP | 2008187375 A | 8/2008 |
| JP | 2016131366 A | 7/2016 |

OTHER PUBLICATIONS

U.S. Appl. No. 16/438,491, filed Jun. 12, 2019, to Yuichi Miyahara.

*Primary Examiner* — Lam T Mai

(57) ABSTRACT

Provided is a delta-sigma AD converter including a delta-sigma modulating section that outputs a digital signal obtained by performing delta-sigma modulation with an oversampling ratio on an input analog signal; a digital filtering section that filters the digital signal with the oversampling ratio; a control terminal into which an external control signal is input; an output control section that performs control to output an output signal based on the filtered digital signal, according to the external control signal; and a setting section that sets the oversampling ratio based on interval information of the external control signal.

12 Claims, 7 Drawing Sheets

(56) References Cited

U.S. PATENT DOCUMENTS

| | | | | |
|---|---|---|---|---|
| 2010/0045376 A1* | 2/2010 | Soenen | ................ | H03F 3/2173 |
| | | | | 330/251 |
| 2011/0102223 A1* | 5/2011 | Kinyua | ................ | H03M 3/344 |
| | | | | 341/143 |
| 2012/0057381 A1* | 3/2012 | Kimpara | ............... | H02M 7/537 |
| | | | | 363/78 |
| 2013/0066934 A1 | 3/2013 | Edo | | |
| 2013/0135131 A1* | 5/2013 | Tai | .......................... | G01K 7/16 |
| | | | | 341/143 |
| 2013/0335049 A1* | 12/2013 | Schubert | ................ | H03K 7/08 |
| | | | | 323/283 |
| 2016/0142072 A1 | 5/2016 | Richter | | |
| 2016/0197619 A1* | 7/2016 | Katayama | ............... | H03M 1/12 |
| | | | | 341/143 |

\* cited by examiner

DELTA-SIGMA AD CONVERTER AND DELTA-SIGMA AD CONVERTING METHOD

CROSS-REFERENCE TO RELATED APPLICATIONS

This application is a continuation of U.S. patent application Ser. No. 16/438,491, filed on Jun. 12, 2019, which claims priority to Japanese patent Application No. 2018-112335, filed on Jun. 12, 2018, and Japanese Patent Application No. 2019-080476, filed on Apr. 19, 2019, the contents of each of which are incorporated herein by reference in their entirety.

BACKGROUND

1. Technical Field

The present invention relates to a delta-sigma AD converter and a delta-sigma AD converting method.

2. Related Art

A delta-sigma AD converter can realize a high S/N ratio by sampling an input signal with a sampling rate that is significantly higher than the output rate. Here, the number of samplings of the input signal during one period of the output rate is referred to as the oversampling ratio (OSR), and it is usually possible to realize a higher S/N ratio when the OSR is higher and to realize a higher output rate when the OSR is lower, for the same sampling rate. Patent Document 1 discloses a delta-sigma AD converter that has a variable OSR.

Patent Document 1: U.S. Pat. No. 7,215,270

In Patent Document 1, the delta-sigma AD converter is provided with a dedicated control terminal for enabling the selection of the OSR. Therefore, the delta-sigma AD converter in Patent Document 1 has a greater number of terminals than a delta-sigma converter with a fixed OSR.

SUMMARY

To solve the above problem, as a first aspect of the present invention, provided is a delta-sigma AD converter. The delta-sigma AD converter may comprise a delta-sigma modulating section that outputs a digital signal obtained by performing delta-sigma modulation with an oversampling ratio on an input analog signal. The delta-sigma AD converter may comprise a digital filtering section that filters the digital signal with the oversampling ratio. The delta-sigma AD converter may comprise a control terminal into which an external control signal is input. The delta-sigma AD converter may comprise an output control section that performs control to output an output signal based on the filtered digital signal, according to the external control signal. The delta-sigma AD converter may comprise a setting section that sets the oversampling ratio based on interval information of the external control signal.

The external control signal may designate a start timing of a conversion cycle. The setting section may change a time period from the start timing to an output timing at which the output control section outputs the output signal, according to the set oversampling ratio.

The setting section may change a filter coefficient of the digital filtering section, according to the set oversampling ratio.

The delta-sigma modulating section may include an analog integrating section that integrates a signal that is based on the input analog signal. The setting section may change the number of times the analog integrating section performs the integration, according to the set oversampling ratio.

The external control signal may designate a start timing of a conversion cycle by changing from a first logic value to a second logic value. The setting section may set the oversampling ratio based on a length of a target interval that is an interval during which the external control signal is the first logic value, an interval during which the external control signal is the second logic value, or a total interval that includes the interval during which the external control signal is the first logic value and the interval during which the external control signal is the second logic value.

The output control section may output the output signal at a timing corresponding to a clock signal input thereto. The setting section may set the oversampling ratio based on the number of clock pulses of the clock signal in the target interval.

The setting section may set the oversampling ratio of a following conversion cycle based on the external control signal.

The setting section may sequentially set a number of oversampling ratios that corresponds to the length of the target interval, among a plurality of oversampling ratios, in the conversion cycle. The output control section may sequentially output the output signal corresponding to the sequentially set oversampling ratios in the conversion cycle.

The delta-sigma modulating section may include an analog integrating section that integrates a signal that is based on the input analog signal. The delta-sigma modulating section may include a quantizing section that quantizes an output signal of the analog integrating section. The delta-sigma modulating section may include a DA converting section that generates a feedback signal based on output of the quantizing section. The delta-sigma modulating section may include an adding section that adds the feedback signal from the DA converting section to the input analog signal. The analog integrating section may integrate output of the adding section.

The delta-sigma modulating section may further include a resetting section that resets an integrated value held by the analog integrating section every conversion cycle.

As a second aspect of the present invention, provided is a delta-sigma AD conversion program that is executed by a computer. The delta-sigma AD conversion program may cause the computer to function as a delta-sigma modulating section that outputs a digital signal obtained by performing delta-sigma modulation with an oversampling ratio on an input analog signal. The delta-sigma AD conversion program may cause the computer to function as a digital filtering section that filters the digital signal with the oversampling ratio. The delta-sigma AD conversion program may cause the computer to function as an output control section that performs control to output an output signal based on the filtered digital signal, according to an external control signal input from a control terminal. The delta-sigma AD conversion program may cause the computer to function as a setting section that sets the oversampling ratio based on interval information of the external control signal.

As a third aspect of the present invention, provided is a delta-sigma AD converting method. In the delta-sigma AD converting method, the delta-sigma AD converter may output a digital signal obtained by performing delta-sigma modulation with an oversampling ratio on an input analog signal. In the delta-sigma AD converting method, the delta-sigma AD converter may filter the digital signal with the oversampling ratio. In the delta-sigma AD converting method, the delta-sigma AD converter may perform control to output an output signal based on the filtered digital signal, according to an external control signal input from a control terminal. In the delta-sigma AD converting method, the delta-sigma AD converter may set the oversampling ratio based on interval information of the external control signal.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
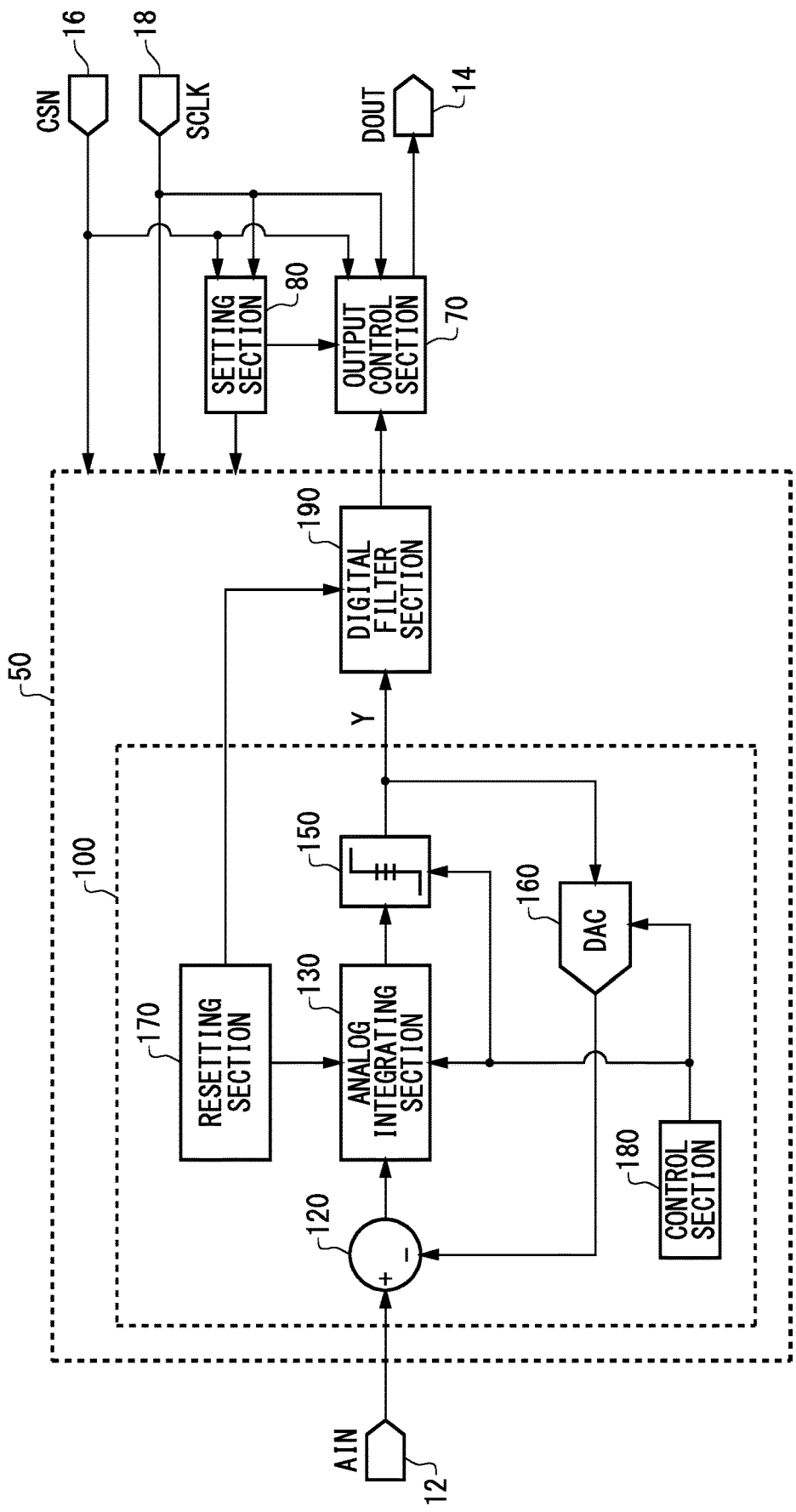
FIG. 1 shows an example of a configuration of a delta-sigma AD converter 10 according to the present embodiment.

FIG. 1 shows an example of a configuration of a delta-sigma AD converter 10 according to the present embodiment. The delta-sigma AD converter 10 is an incremental AD converter that resets the circuits therein, and converts an analog signal AIN input from an input terminal 12 into a digital signal DOUT and outputs the digital signal DOUT from an output terminal 14. The delta-sigma AD converter 10 controls the output from the output terminal 14 according to input made to an output control terminal 16 and a clock terminal 18. In the present embodiment, the output control terminal 16 also functions as a terminal for inputting an OSR setting. The delta-sigma AD converter 10 includes the input terminal 12, the output terminal 14, the output control terminal 16, the clock terminal 18, an AD converting section 50, an output control section 70, and a setting section 80.

The input terminal 12 receives an input analog signal AIN. The input terminal 12 may be a single-ended input, or may instead be a differential input. If the input terminal 12 is a differential input, this input terminal 12 receives a positive signal AINP from a positive input and receives a negative signal AINN from a negative input. The input terminal 12 supplies the AD converting section 50 with the input analog signal AIN input thereto.

The output terminal 14 outputs a digital signal DOUT obtained by a conversion performed by the delta-sigma AD converter 10 according to the input analog signal AIN. The output terminal 14 may be a single-ended output, or may instead be a differential output.

The output control terminal 16 is an example of a control terminal, and receives an external control signal CSN. In the present embodiment, the external control signal CSN designates the start timing of a conversion cycle. As an example, the external control signal CSN designates the start timing of the conversion cycle by changing from a first logic value (e.g. logical H) to a second logic value (e.g. logical L). In this way, the external control signal CSN resets the AD converting section 50 during the logical H interval, and instructs the delta-sigma AD converter 10 to start the AD conversion process and the digital signal DOUT output process in response to becoming logical L.

The clock terminal 18 receives a clock signal SCLK. In the present embodiment, the clock signal SCLK is used as a clock for designating a sampling timing of the input analog signal AIN by the delta-sigma AD converter 10 and an output timing of the digital signal DOUT by the delta-sigma AD converter 10.

The AD converting section 50 includes a delta-sigma modulating section 100 and a digital filtering section 190. The delta-sigma modulating section 100 outputs a modulated digital signal Y obtained by performing delta-sigma modulation on the input analog signal AIN. The delta-sigma modulating section 100 includes an adding section 120, an analog integrating section 130, a quantizing section 150, a DA converting section 160, a resetting section 170, and a control section 180.

The adding section 120 adds a feedback signal from the DA converting section 160 to the input analog signal AIN input from the input terminal 12. If the input terminal 12 is a differential input, the adding section 120 may add feedback signals with different signs respectively to the positive signal AINP and the negative signal AINN of the differential signal. The adding section 120 supplies the analog integrating section 130 with the addition result.

The analog integrating section 130 includes a plurality of analog integrators connected in cascade, and integrates a signal that is based on the input analog signal. The analog integrating section 130 integrates the output of the adding section 120. The analog integrating section 130 supplies the quantizing section 150 with the integration result, as an output signal.

The quantizing section 150 quantizes the output signal of the analog integrating section 130. The quantizing section 150 quantizes the integration result of the analog integrating section 130, according to the clock signal SCLK or the like supplied from the outside, and outputs a bit stream corresponding to the integration result. The quantizing section 150 may include a 1-bit quantizer or a multi-bit quantizer. In other words, the quantizing section 150 may quantize the output signal of the analog integrating section 130 to be a binary or multi-value digital signal.

As an example, if a 1-bit quantizer is used as the quantizing section 150, the bit stream is a sequence (serial digital code) of a predetermined number of pieces of 1-bit data (digital code), and the value obtained by integrating this digital code is a digital value proportional to or substantially matching the amplitude value of the input analog signal AIN. The quantizing section 150 may compare the output signal to a predetermined threshold value at every pulse of the clock signal SCLK, and convert this output signal to a digital code of 1 or 0 according to whether the output signal exceeds this threshold value.

As another example, if an M-bit quantizer is used as the quantizing section 150, the bit stream is a sequence (serial digital code) of a predetermined number of pieces of M-bit data (digital code), and the value obtained by integrating this digital code is a digital value proportional to or substantially matching the amplitude value of the input analog signal AIN. The quantizing section 150 may compare the output signal to a predetermined M-bit threshold value using a number of comparators corresponding to the M bits, at every pulse of the clock signal SCLK, and convert this output signal to an M-bit digital code according to whether each comparator determines that the output signal exceeds the threshold value.

In other words, the delta-sigma AD converter 10 converts the input analog signal AIN into a digital value in each constant conversion cycle, and the quantizing section 150 outputs the serial digital code corresponding to the input analog signal AIN according to the clock signal SCLK or the like supplied from the outside. In this way, for each of the plurality of samples synchronized with the clock signal SCLK, the input analog signal AIN is converted into a digital value, and the number of samples in one conversion cycle is the oversampling ratio (OSR). In other words, the number of digital codes included in the serial digital code is equal to the OSR.

As an example, if the OSR of the delta-sigma AD converter 10 is 60, the quantizing section 150 outputs a serial digital code that includes 60 digital codes in every single conversion cycle. The quantizing section 150 supplies the quantized digital signal Y to the DA converting section 160 and the digital filtering section 190.

The DA converting section 160 outputs the feedback signal that is based on the output of the quantizing section 150. The DA converting section 160 DA-converts the digital signal Y output by the quantizing section 150 into a corresponding analog signal, and supplies the adding section 120 with the converted analog signal as the feedback signal. The feedback signal may be a predetermined reference voltage. The DA converting section 160 may convert the digital signal Y into the analog signal in synchronization with the clock signal.

The resetting section 170 resets the integrated value held by the analog integrating section 130, at every predetermined period. In the present embodiment, the resetting section 170 resets the integrated value held by the analog integrating section 130, for every conversion cycle. Here, the resetting section 170 may reset the integrated value held by the analog integrating section 130 in response to the external control signal CSN. For example, the resetting section 170 resets the integrated value held by the analog integrating section 130 in response to the external control signal CSN becoming logical H. Furthermore, the resetting section 170 may reset the digital filtering section 190 at the timing when the analog integrating section 130 is reset. The resetting section 170 may reset the analog integrating section 130 and the digital filtering section 190 every time the input analog signal AIN is converted to a digital value by the delta-sigma AD converter 10. The resetting section 170 supplies the reset signal to the analog integrating section 130 and the digital filtering section 190 to reset each of these sections, once every cycle of the input analog signal AIN being converted into a digital value, for example.

The control section 180 controls the operation of the delta-sigma modulating section 100. For example, the control section 180 controls the operation of the analog integrating section 130. The control section 180 may control the delta-sigma modulating section 100 according to the clock signal SCLK supplied from outside. Alternatively, the control section 180 may include a clock oscillator and control the clock oscillator to control the operation of each component.

The digital filtering section 190 filters the modulated digital signal output by the quantizing section 150. The digital filtering section 190 filters the digital signal Y received from the quantizing section 150, and outputs the result. The digital filtering section 190 may be an integration filter that performs digital integration by integrating the bit stream of the digital signal Y. In this case, the digital filtering section 190 may calculate a digital value by multiplying the integrated value by a predetermined coefficient. The digital filtering section 190 may calculate the digital value in synchronization with the clock signal SCLK. Furthermore, the digital filtering section 190 may reset the integration amount in response to receiving a reset signal from the resetting section 170.

The digital filtering section 190 may include a low-pass filter and reduce the quantization noise generated by the quantizing section 150. The digital filtering section 190 may include a decimation filter to reduce the sampling frequency. The digital filtering section 190 may supply the output terminal 14 with the digital value that is the calculation result. The output terminal 14 outputs the received digital value as the digital output ADO[n−1:0] of the AD converting section 50. Here, n indicates the number of bits in the digital output that is output by the digital filtering section 190.

The output control section 70 performs control to output the output signal DOUT based on the filtered modulated digital signal, in response to the external control signal CSN input thereto. The output control section 70 may output the output signal DOUT at a timing corresponding to the clock signal SCLK input thereto. The output control section 70 according to the present embodiment serially outputs the output signal DOUT in synchronization with the clock signal SCLK, after a predetermined number of clock pulses of the clock signal SCLK according to the OSR have passed from the start timing of the conversion cycle designated by the external control signal CSN. As an example, the CSN is a chip selection signal of an SPI (Serial Peripheral Interface), and SCLK is a clock signal of the SPI.

The setting section 80 sets the OSR of the AD conversion based on the external control signal CSN. Here, the setting section 80 may set the OSR of the AD conversion based on interval information of the external control signal CSN, i.e. the period of change or the interval during which the value of the external control signal CSN is a prescribed logic value, for example. The setting section 80 instructs the AD converting section 50 and the output control section 70 to operate according to the set OSR.

In this way, the delta-sigma AD converter 10 according to the present embodiment repeats the resetting of the analog integrating section 130 and the digital filtering section 190 by the resetting section 170 and the conversion of the input analog signal AIN into the digital output, in synchronization with the clock signal SCLK. The delta-sigma AD converter 10 does not need to include the resetting section 170, in which case the delta-sigma AD converter 10 does not perform the reset operation every predetermined period and operates as a non-incremental delta-sigma AD converter.

The delta-sigma AD converter 10 according to the present invention can set the OSR using the output control terminal 16 for controlling the output of the output signal DOUT.

Therefore, the delta-sigma AD converter 10 can realize a function of enabling change of the OSR without increasing the number of control terminals.

Figure 2:
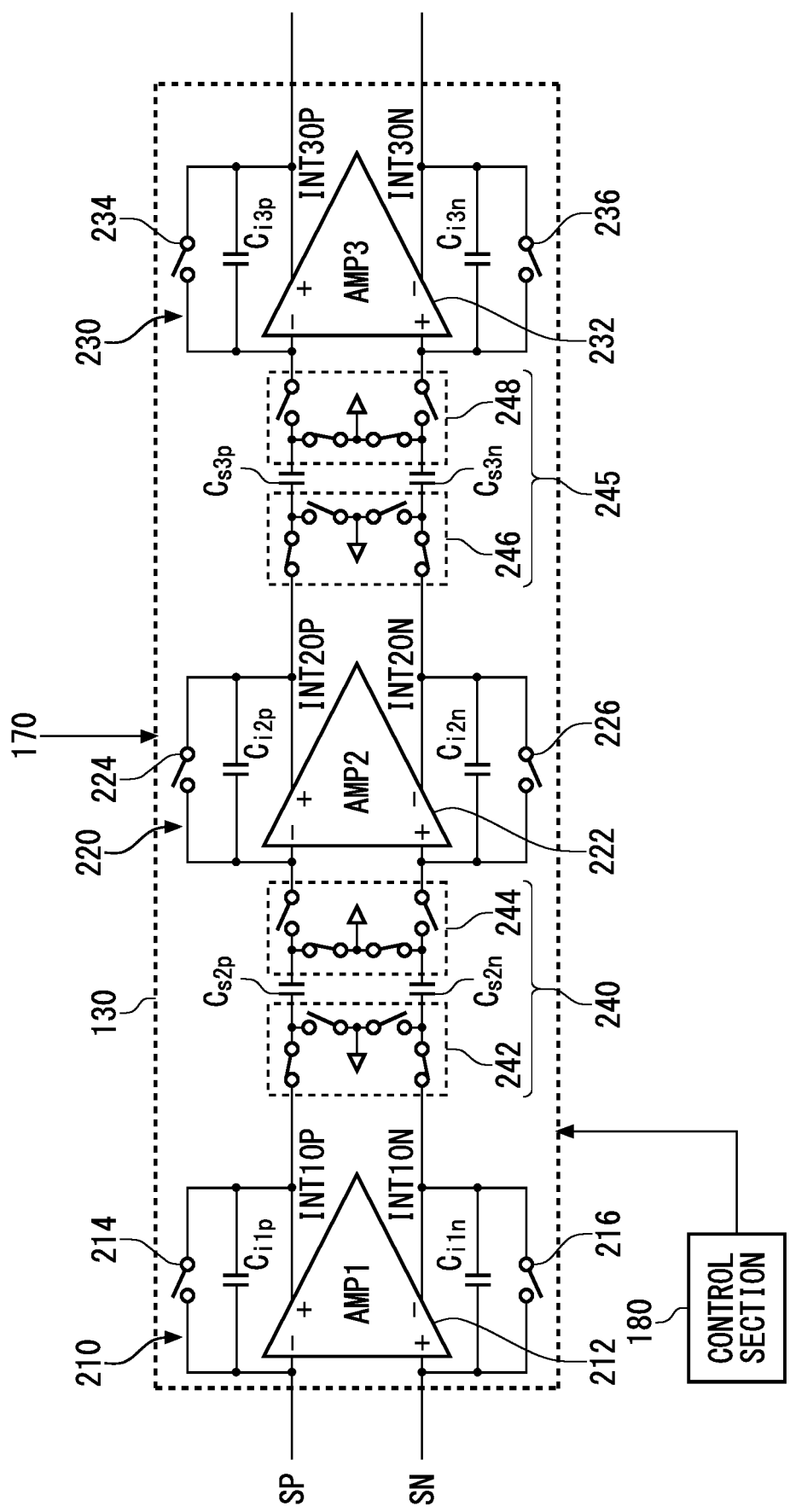
FIG. 2 shows an example of a configuration of the analog integrating section 130 according to the present embodiment.

FIG. 2 shows an example of a configuration of the analog integrating section 130 according to the present embodiment. FIG. 2 shows an example of the analog integrating section 130 of the delta-sigma AD converter 10 shown in FIG. 1. FIG. 2 shows an example in which a differential signal formed by a positive signal SP and a negative signal SN are input to the analog integrating section 130 from the adding section 120. The analog integrating section 130 includes a plurality of analog integrators and a plurality of switched capacitors.

FIG. 2 shows an example in which the analog integrating section 130 three analog integrators, which are a first analog integrator 210, a second analog integrator 220, and a third analog integrator 230. Furthermore, the analog integrating section 130 of the present example includes two switched capacitors, which are a first switched capacitor 240 and a second switched capacitor 245.

Furthermore, FIG. 2 shows an example in which each of the three analog integrators includes two input terminals and two output terminals, receives a differential signal, and outputs a differential signal. One of the two input terminals of each analog integrator is a first input terminal, and the other is a second input terminal. Furthermore, one of the two output terminals of each analog integrator is a first output terminal, and the other is a second output terminal.

Each analog integrator includes an analog amplifier, a feedback capacitor, and a reset switch. FIG. 2 shows an example in which the first analog integrator 210 includes a first analog amplifier 212, a positive feedback capacitor $C_{i1p}$, a negative feedback capacitor $C_{i1n}$, a positive reset switch 214, and a negative reset switch 216. Furthermore, in the present example, the second analog integrator 220 includes a second analog amplifier 222, a positive feedback capacitor $C_{i2p}$, a negative feedback capacitor $C_{i2n}$, a positive reset switch 224, and a negative reset switch 226, and the third analog integrator 230 includes a third analog amplifier 232, a positive feedback capacitor $C_{i3p}$, a negative feedback capacitor $C_{i3n}$, a positive reset switch 234, and a negative reset switch 236.

The analog amplifier amplifies and outputs signals input respectively to the positive input terminal and the negative input terminal. For example, the analog amplifier is a differential input amplification circuit. Furthermore, the analog amplifier may have a single-ended output, or may instead have a differential output. As an example, the analog amplifier is an OP amplifier. FIG. 2 shows an example in which the three analog amplifiers, i.e. the first analog integrator 210, the second analog integrator 220, and the third analog integrator 230, each have a differential input and a differential output. In FIG. 2, the positive input terminals of the analog amplifiers are connected to the first input terminals of the analog integrators, and the negative input terminals are connected to the second input terminals of the analog integrators.

Each feedback capacitor sequentially accumulates a charge corresponding to the input signal. For example, for every sampling, the feedback capacitor sequentially accumulates a charge from a previous stage to a later stage. As an example, according to the positive signal SP, the charge accumulated in the positive feedback capacitor $C_{i1p}$ at the first clock pulse is accumulated in the positive feedback capacitor $C_{i2p}$ at the following second clock pulse and accumulated in the positive feedback capacitor $C_{i3p}$ at the following third clock pulse. Similarly, according to the negative signal SN, the charge accumulated in the negative feedback capacitor $C_{i1a}$ at the first clock pulse is accumulated in the negative feedback capacitor $C_{i2n}$ at the following second clock pulse and accumulated in the negative feedback capacitor $C_{i3n}$ at the following third clock pulse.

Each reset switch discharges the charge accumulated in the corresponding feedback capacitor to reset the corresponding analog integrator, in response to instructions from the resetting section 170. For example, the reset switch creates a connection between the terminals of the feedback capacitor to discharge the accumulated charge, in response to the reset signal supplied from the resetting section 170. In the example of FIG. 2, the positive reset switch 214, the negative reset switch 216, the positive reset switch 224, the negative reset switch 226, the positive reset switch 234, and the negative reset switch 236 are each switched to the ON state to reset the first analog integrator 210, the second analog integrator 220, and the third analog integrator 230, in response to instructions from the resetting section 170.

The switched capacitors are provided between the analog integrators, and each transmit the charge accumulated in the analog integrator connected at the previous stage to the analog integrator connected at the following stage. Each switched capacitor includes a charge/discharge capacitor and switches provided at a stage before this capacitor and a stage after this capacitor. The previous-stage switch switches the connection destination of one terminal of the capacitor between a reference potential and a previous-stage circuit of the switched capacitor. The later-stage switch switches the connection destination of the other terminal of the capacitor between a reference potential and the later-stage circuit of the switched capacitor. Here, the reference potential may be a predetermined potential, e.g. 0 V.

One terminal of the switched capacitor is connected to the previous-stage analog integrator and the other terminal of the switched capacitor is connected to the reference potential, during one clock pulse, for example, thereby charging this capacitor with the output charge of the previous-stage analog integrator connected thereto. In this case, during the next clock pulse, the one terminal of the switched capacitor is connected to the reference potential and the other terminal of the switched capacitor is connected to the later-stage analog integrator, thereby causing the charge accumulated by this capacitor to be discharged to the later-stage analog integrator.

FIG. 2 shows an example in which the first switched capacitor 240 is connected between the first analog integrator 210 and the second analog integrator 220. The first switched capacitor 240 charges the capacitor $C_{s2p}$ with the charge accumulated in the previous-stage positive feedback capacitor $C_{i1p}$ and discharges, i.e. transmits, this charge to the later-stage positive feedback capacitor $C_{i2p}$, using the previous-stage switch 242 and the later-stage switch 244. In this case, in the same manner, the first switched capacitor 240 charges the capacitor $C_{s2n}$ with the charge accumulated in the previous-stage negative feedback capacitor $C_{i1n}$ and discharges, i.e. transmits, this charge to the later-stage negative feedback capacitor $C_{i2n}$.

Furthermore, FIG. 2 shows an example in which the second switched capacitor 245 is connected between the second analog integrator 220 and the third analog integrator 230. The second switched capacitor 245 charges the capacitor $C_{s3p}$ with the charge accumulated in the previous-stage positive feedback capacitor $C_{i2p}$ and discharges, i.e. transmits, this charge to the later-stage positive feedback capacitor $C_{i3p}$, using the previous-stage switch 246 and the later-stage switch 248. In this case, in the same manner, the second switched capacitor 245 charges the capacitor $C_{s3n}$ with the charge accumulated in the previous-stage negative feedback capacitor $C_{i2n}$ and discharges, i.e. transmits, this charge to the later-stage negative feedback capacitor $C_{i3n}$.

As described above, the analog integrating section 130 has the plurality of analog integrators connected in series, and sequentially accumulates and transmits the positive signal SP and the negative signal SN from the previous-stage analog integrator to the later-stage analog integrator, every clock pulse. The analog integrating section 130 outputs the charge accumulated in the feedback capacitor of the analog integrator at the last stage to the quantizing section 150. For example, the analog integrating section 130 shown in FIG. 2 includes three stages of analog integrators, and therefore the charge accumulated in the first analog integrator 210 at the first clock pulse is transmitted to the third analog integrator 230 during the third clock pulse and output to the quantizing section 150.

Furthermore, the control section 180 supplies a control signal to the analog integrating section 130 to cause the analog integrating section 130 to operate in the manner described above. As an example, the control section 180 supplies the analog integrating section 130 with the clock signal SCLK from the clock terminal 18. Instead, the control section 180 may include a clock oscillator that generates a clock signal with a predetermined frequency, and supply the clock signal to the analog integrating section 130. The control section 180 may supply the clock signal to the analog integrating section 130, and stop the integration operation of the analog integrating section 130.

FIG. 2 shows an example in which the analog integrating section 130 includes three analog integrators, but instead, the analog integrating section 130 may include two or four or more analog integrators. In this case, one or three or more switched capacitors may be provided to the analog integrating section 130, according to the number of analog integrators. Instead, the analog integrating section 130 may include one analog integrator.

The delta-sigma AD converter 10 according to the present embodiment described above integrates the analog signal input thereto and, according to a quantized result of the integration result, performs feedback control to add a reference voltage to this input analog signal or subtract the reference voltage from this input analog signal. In this way, the delta-sigma AD converter 10 can accurately output a serial digital code corresponding to the input analog signal. Furthermore, the delta-sigma AD converter 10 can perform digital processing on such a serial digital code to accurately output the digital signal corresponding to the analog signal.

The incremental delta-sigma AD converter 10 differs from a general delta-sigma AD converter by performing a reset by discharging the charge accumulated in the analog integrating section 130 at a constant period. In this way, the digital value resulting from the conversion in one conversion cycle can be a value that is more precisely converted from the value of the analog input signal, without being affected by the charge accumulated in cycles other than the one conversion cycle.

The following describes the digital output voltage of such a delta-sigma AD converter 10. Here, for the i-th clock signal pulse from when the reset signal is supplied by the resetting section 170, the input voltage from the input terminal 12 is $V_{in}(i)$ and the digital output of the quantizing section 150 is $Y(i)$. Furthermore, the clock signal pulse is generated m times in one conversion cycle. Here, with $V_{out}(m)$ representing the analog output that is output last in the one conversion cycle by the last-stage integrator of the analog integrating section 130, $V_{out}(m)$ can be expressed as shown in the expression below.

$$V_{out}(m) = \Sigma\Sigma[C_1 \cdot \Sigma\{V_{in}(i) - Y(i)\}]$$

$$= C_1 \cdot \Sigma\Sigma\Sigma\{V_{in}(i) - Y(i)\} \quad \text{Expression 1:}$$

Here, $V_{ana}$ represents the analog voltage of the analog signal to be converted into the digital signal in one conversion cycle by the delta-sigma converter 10. For example, in a case where the input voltage from the input terminal 12 is a substantially constant voltage with almost no fluctuation in the one cycle, or a case where the input voltage is a substantially constant sampled voltage due to a sample/hold circuit or the like, the analog voltage $V_{ana}$ becomes this substantially constant voltage. Furthermore, in a case where the input voltage from the input terminal 12 fluctuates during one conversion cycle, the analog voltage $V_{ana}$ may be a value substantially equal to the average value of the fluctuating voltage during this one conversion cycle. In other words, the analog voltage $V_{ana}$ can be expressed as shown in the expression below, using the input voltage $V_{in}(i)$ at the i-th clock signal pulse.

$$V_{ana} = C_1 \cdot \Sigma\Sigma\Sigma V_{in}(i) / C_1 \cdot \Sigma\Sigma\Sigma \quad \text{Expression 2:}$$

The following expression is obtained by rewriting Expression 1 and substituting this expression into Expression 2.

$$V_{ana} = \{C_1 \cdot \Sigma\Sigma\Sigma(i) + V_{out}(m)\} / (C_1 \cdot \Sigma\Sigma\Sigma) \quad \text{Expression 3:}$$

The first term in Expression 3 corresponds to the result obtained by the digital filtering section 190 integrating the digital signal $Y(i)$ quantized by the quantizing section 150. In other words, the delta-sigma AD converter 10 shown in FIG. 1 outputs the first term of Expression 3 as the AD conversion result for the analog voltage $V_{ana}$ input thereto. Accordingly, the delta-sigma AD converter 10 logically outputs a value missing the second term of Expression 3, and therefore a quantization error is included in the digital output.

The second term of Expression 3 is the analog output that is output last in the one conversion cycle by the analog integrating section 130, as shown by Expression 1. Accordingly, this shows that a residual component that can cause quantization noise remains in the output of the last-stage integrator of the analog integrating section 130. The delta-sigma AD converter 10 may set the number of samples in one conversion cycle to be high enough that the effect of this residual component can be ignored.

Instead, after the analog integrating section 130 has output this residual component, the delta-sigma AD converter 10 may continue the operation of the digital filtering section 190 according to the clock signal. In this way, the digital filtering section 190 integrates this residual component, and can therefore reduce the quantization error.

Furthermore, the delta-sigma AD converter 10 may be configured to feed the residual component of the analog integrating section 130 from each analog integrator that is not at the last stage to the quantizing section 150 to add these residual components together, in order to reduce the quantization error without changing the length of one conversion cycle.

Figure 3:
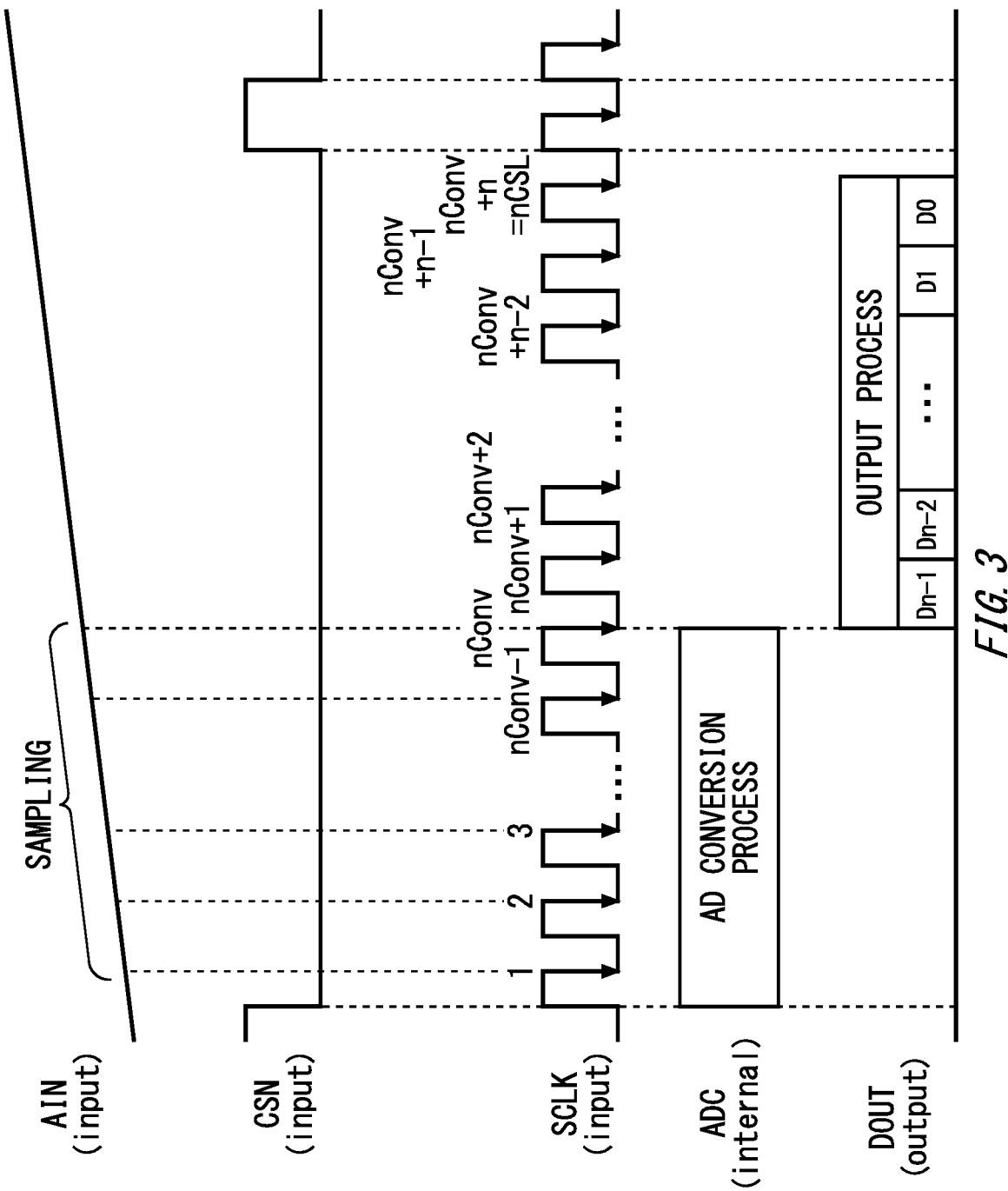
FIG. 3 shows a timing chart of the AD conversion performed by the delta-sigma AD converter 10 according to the present embodiment.

FIG. 3 shows a timing chart of the AD conversion performed by the delta-sigma AD converter 10 according to the present embodiment. The timing chart in the present drawing indicates time in the horizontal direction, and shows changes in the values of the input analog signal AIN, the external control signal CSN, the clock signal SCLK, and the output signal DOUT in one conversion cycle.

The delta-sigma AD converter 10 starts the conversion cycle in response to the falling of the external control signal CSN. When the conversion cycle starts, during the time period from clock pulse 1 to clock pulse nConv in the clock signal SCLK immediately after the conversion cycle starts, the AD converting section 50 samples the input analog signal AIN and performs the AD conversion process every clock cycle. Here, nConv is the number of clock cycles necessary for the AD conversion process.

More specifically, for every clock cycle of the clock signal SCLK, the analog integrating section 130 samples the integrated value of a signal based on the input analog signal AIN and output by the adding section 120. The quantizing section 150 quantizes the output signal of the analog integrating section 130 at every clock cycle, and outputs the result as the modulated digital signal Y to the digital filtering section 190. The digital filtering section 190 outputs to the output control section 70 the digital output ADO [n−1:0], which is the result of the AD conversion at the timing of the clock pulse nConv at which the filtering process on the modulated digital signal Y input thereto every clock cycle is not performed.

The output control section 70 performs the output process of the output signal DOUT as the AD conversion result in the conversion cycle between the clock pulses nConv and nConv+n. More specifically, for every clock cycle of the clock signal SCLK, the output control section 70 outputs the bits Dn−1 to D0 forming the digital output ADO[n−1:0] in order to the output terminal 14. In the present drawing, the output control section 70 outputs the bits Dn−1 to D0 in order from the highest bit, but the output control section 70 may instead output the bits Dn−1 to D0 in order from the lowest bit or in any other order. Furthermore, the output control section 70 may output the bits Dn−1 to D0 in parallel in units of a predetermined number of bits, or may output all of the bits in one cycle.

The resetting section 170 resets the integrated value held by the analog integrating section 130, in response to the external control signal CSN becoming logical H.

In the above description, the output rate of the delta-sigma AD converter 10 is the frequency corresponding to one period (=conversion cycle) of the external control signal CSN, and the number of times the input analog signal AIN is sampled by the delta-sigma AD converter 10 during one period of the output rate is nConv. The OSR of the delta-sigma AD converter 10 corresponds to the number of clock pulses of the clock signal SCLK used to sample the input analog signal AIN included in one period of the external control signal CSN. For example, in a case where the number of clock pulses of the clock signal SCLK used to sample the input analog signal AIN included in one period of the external control signal CSN is 60, the OSR is 60. Here, CSL represents the number of clock pulses of the clock signal SCLK needed from the start of the sampling of the input analog signal AIN to the completion of the output of the serial digital output ADO[n−1:0] during the interval when the external control signal CSN is logical L in the conversion cycle.

Figure 4:
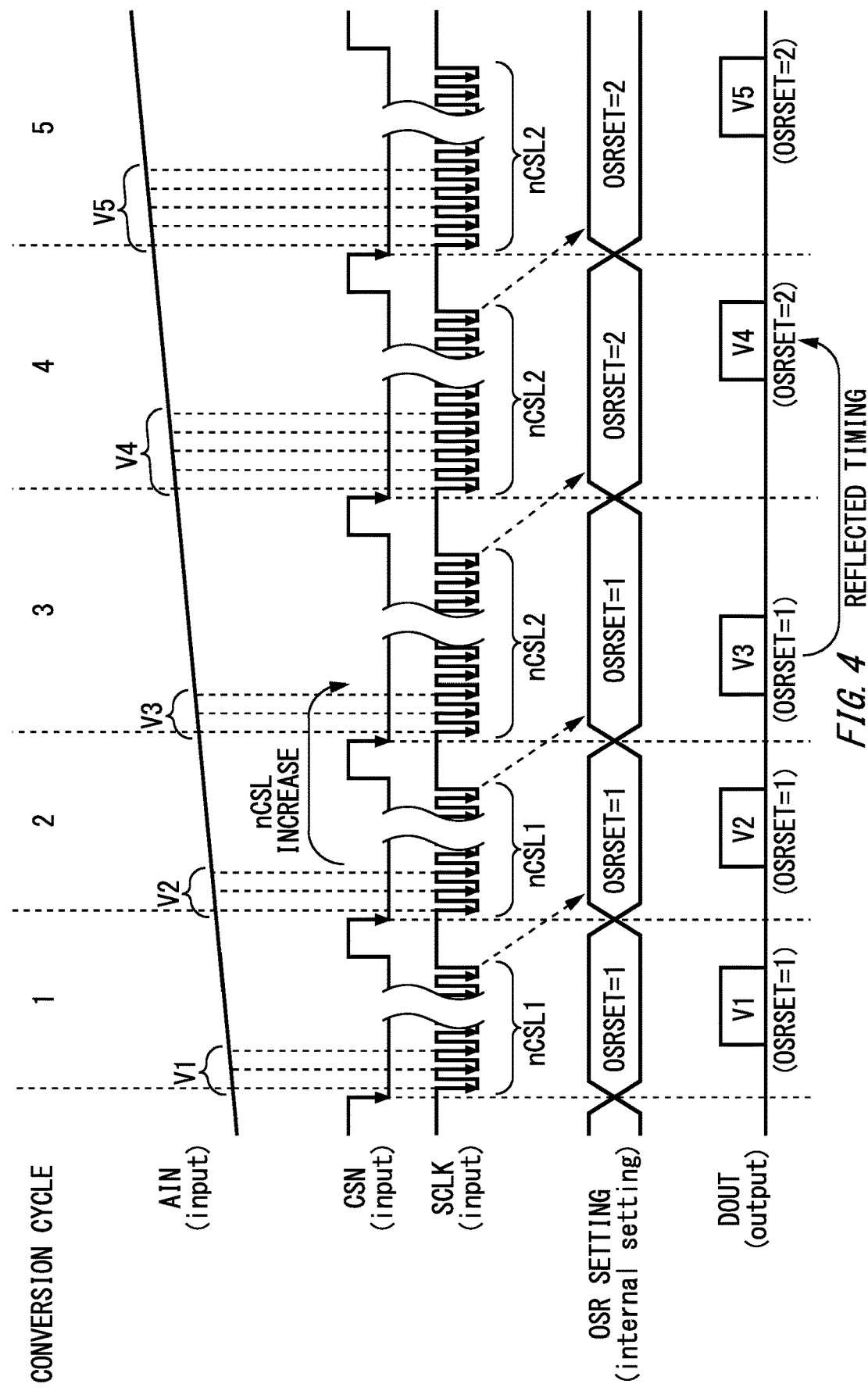
FIG. 4 shows a timing chart of the AD conversion performed by the delta-sigma AD converter 10 according to the present embodiment.

FIG. 4 shows a timing chart of the AD conversion performed by the delta-sigma AD converter 10 according to the present embodiment. The timing chart of the present drawing indicates time in the horizontal direction, and indicates the values of the conversion cycle number, the input analog signal AIN, the external control signal CSN, the clock signal SCLK, the OSR setting, and the output signal DOUT arranged in the vertical direction. In the timing chart of the present drawing, the delta-sigma AD converter 10 changes the OSR setting in cycle 4, in response to instructions for changing the OSR setting being input to the external control signal CSN in cycle 3.

The setting section 80 stores the OSR setting value OSRSET in an internal register or the like. OSRSET is identification information identifying the OSR set for the delta-sigma AD converter 10, among a plurality of settable OSRs. The setting section 80 may store at least one of a number of clock pulses, nCSL, and the nCSL range of the conversion cycle in association with each of the plurality of settable OSRs.

At the start timing of conversion cycle 1, the setting section 80 sets the OSR corresponding to OSRSET=1, by setting OSRSET to be 1.

The setting section 80 may change the number of times the analog integrating section 130 performs integration, according to the set OSR. For example, the setting section 80 may hold in advance a number of integrations (e.g. nConv value) corresponding to each of the plurality of settable OSRs, and set the number of clock cycles needed for the AD conversion process by setting the number of integrations corresponding to the set OSR in the control section 180.

Furthermore, the setting section 80 may change a filter coefficient of the digital filtering section 190 according to the set OSR. As an example, the digital filtering section 190 is a FIR (Finite Impulse Response) filter or an IIR (Infinite Impulse Response) filter, and has one or more filter coefficients that determine the characteristics of the filter. Here, the set of filter coefficients of the digital filtering section 190 used in the AD version differ according to the OSR, due to at least one of the number of samples of the input analog signal AIN used to calculate the digital output ADO[n−1:0] according to the OSR and the number of clock pulses from the start of the sampling until the output of the digital output ADO[n−1:0] being different, for example. Therefore, the setting section 80 may hold in advance a set of filter coefficients to be set in the digital filtering section 190 in association with each of the plurality of settable OSRs, and set the set of filter coefficients corresponding to the set OSR in the digital filtering section 190.

Furthermore, the setting section 80 may change the time period from the start timing to the output timing at which the output control section 70 outputs the output signal, according to the set OSR. For example, the setting section 80 may hold in advance a value (e.g. nConv value) indicating the start timing of the output process in association with each of the plurality of settable OSRs, and set the number of clock cycles from the start timing of the conversion cycle to the start timing of the output process, by setting the start timing of the output process corresponding to the set OSR in the output control section 70.

The AD converting section 50 receives the settings made by the setting section 80, samples the input analog signal AIN (analog value V1) with the OSR corresponding to OSRSET=1, and filters the modulated digital signal Y with the filter coefficient for the OSR corresponding to OSRSET=1. Furthermore, the output control section 70 outputs the output signal DOUT (digital value V1) at the output timing for the OSR corresponding to OSRSET=1.

Furthermore, the setting section 80 sets an interval during which the external control signal CSN is a second logic value (e.g. logical L) in the conversion cycle to be a target interval, and sets the OSR based on the length of this target interval. The length of such a target interval during which the external control signal CSN is a prescribed value is an example of interval information of the external control signal CSN. The setting section 80 according to the present embodiment measures the length of the target interval according to the number of clock pulses of the clock signal SCLK input thereto, and sets the OSR based on the number of clock pulses of the clock signal in the target interval. Instead, the setting section 80 may measure the length of the target interval using a timer or the like within the delta-sigma AD converter 10.

In the present embodiment, the setting section 80 sets the OSR of the next conversion cycle based on the external control signal CSN in the current conversion cycle. In conversion cycle 1, the external control signal CSN is a second logic value during the nCSL1 clock cycles, and therefore the setting section 80 sets the OSR of the next conversion cycle 2 to be an OSR (OSRSET=1 for conversion cycle 2 in the drawing) that is to be set in a case where the target interval is the nCSL1 clock cycles, from among the plurality of settable OSRs.

At the start timing of conversion cycle 2, the setting section 80 sets the OSR corresponding to OSRSET=1, by setting the OSR setting value OSRSET to be 1, as determined based on the external control signal CSN of the previous conversion cycle.

The AD converting section 50 receives the setting made by the setting section 80, samples the input analog signal AIN (analog value V2) with the OSR corresponding to OSRSET=1, and filters the modulated digital signal Y with the filter coefficient for the OSR corresponding to OSRSET=1. Furthermore, the output control section 70 outputs the output signal DOUT (digital value V2) at the output timing for the OSR corresponding to OSRSET=1.

Furthermore, the setting section 80 sets the OSR (OSRSET=1 for conversion cycle 3 in the drawing) for the next conversion cycle 3, based on the length (nCSL1 clock cycles in the drawing) of the target interval during which the external control signal CSN is the second logic value in conversion cycle 2.

At the start timing of conversion cycle 3, the setting section 80 sets the OSR corresponding to OSRSET=1, by setting the OSR setting value OSRSET to be 1, as determined based on the external control signal CSN of the previous conversion cycle.

The AD converting section 50 receives the setting made by the setting section 80, samples the input analog signal AIN (analog value V3) with the OSR corresponding to OSRSET=1, and filters the modulated digital signal Y with the filter coefficient for the OSR corresponding to OSRSET=1. Furthermore, the output control section 70 outputs the output signal DOUT (digital value V3) at the output timing for the OSR corresponding to OSRSET=1.

Furthermore, the setting section 80 sets the OSR (OSRSET=2 for conversion cycle 4 in the drawing) for the next conversion cycle 4, based on the length (nCSL2 clock cycles in the drawing) of the target interval during which the external control signal CSN is the second logic value in conversion cycle 3. Here, the setting section 80 may set a higher OSR, from among the plurality of settable OSRs, when the target interval is longer.

At the start timing of conversion cycle 4, the setting section 80 sets the OSR corresponding to OSRSET=2, by setting the OSR setting value OSRSET to be 2, as determined based on the external control signal CSN of the previous conversion cycle. As shown in the present drawing, the OSR corresponding to OSRSET=2 is higher than the OSR corresponding to OSRSET=1.

The AD converting section 50 receives the setting made by the setting section 80, samples the input analog signal AIN (analog value V4) with the OSR corresponding to OSRSET=2, and filters the modulated digital signal Y with the filter coefficient for the OSR corresponding to OSRSET=2. Furthermore, the output control section 70 outputs the output signal DOUT (digital value V4) at the output timing for the OSR corresponding to OSRSET=2.

Furthermore, the setting section 80 sets the OSR (OSRSET=2 for conversion cycle 5 in the drawing) for the next conversion cycle 5, based on the length (nCSL2 clock cycles in the drawing) of the target interval during which the external control signal CSN is the second logic value in conversion cycle 4.

At the start timing of conversion cycle 5, the setting section 80 sets the OSR corresponding to OSRSET=2, by setting the OSR setting value OSRSET to be 2, as determined based on the external control signal CSN of the previous conversion cycle.

The AD converting section 50 receives the setting made by the setting section 80, samples the input analog signal AIN (analog value V5) with the OSR corresponding to OSRSET=2, and filters the modulated digital signal Y with the filter coefficient for the OSR corresponding to OSRSET=2. Furthermore, the output control section 70 outputs the output signal DOUT (digital value V5) at the output timing for the OSR corresponding to OSRSET=2.

Furthermore, the setting section 80 sets the OSR for the next conversion cycle 6, based on the length (nCSL2 clock cycles in the drawing) of the target interval during which the external control signal CSN is the second logic value in conversion cycle 5. Here, if the length of the target interval in conversion cycle 5 is within the nCSL range corresponding to OSRSET=1, such as if the this length is nCSL1, the setting section 80 may set the OSR of the next conversion cycle to be the OSR corresponding to OSRSET=1.

As described above, according to the delta-sigma AD converter 10, it is possible to realize a delta-sigma AD converter with a variable OSR by using the external control signal CSN input from outside for performing control to output the output signal DOUT. Therefore, there is no need to add a control terminal for setting the OSR to the delta-sigma AD converter 10. Furthermore, since the delta-sigma AD converter 10 sets the OSR according to the length of the target interval during which the external control signal CSN is in a predetermined state, there is no need to perform a complex sequence of operations to set the OSR, so that the delta-sigma AD converter 10 itself and external circuits can be simplified. Yet further, it is possible to set the OSR continuously for every conversion cycle.

Instead of setting an interval during which the external control signal CSN is the second logic value to be the target interval, the setting section 80 may set an interval during which the external control signal CSN is the first logic value (e.g. logic H) or a total interval (e.g. the conversion cycle itself) that is the combination of the interval during which the external control signal CSN is the first logic value and the interval during which the external control signal CSN is the second logic value to be the target interval, and set the OSR based on the length of this target interval. In accordance with this, appropriate design alterations may be added to the delta-sigma AD converter 10, such as making it possible for the external control signal CSN to rise to the first logic value at an earlier timing, so that the resetting section 170 resets the analog integrating section 130 and the digital filtering section 190 in response to the falling of the external control signal CSN.

Furthermore, the setting section 80 may be capable of setting the OSR using any external control signal or other control signal for performing output control of the delta-sigma AD converter 10, instead of using the external control signal CSN having the functions described above.

Figure 5:
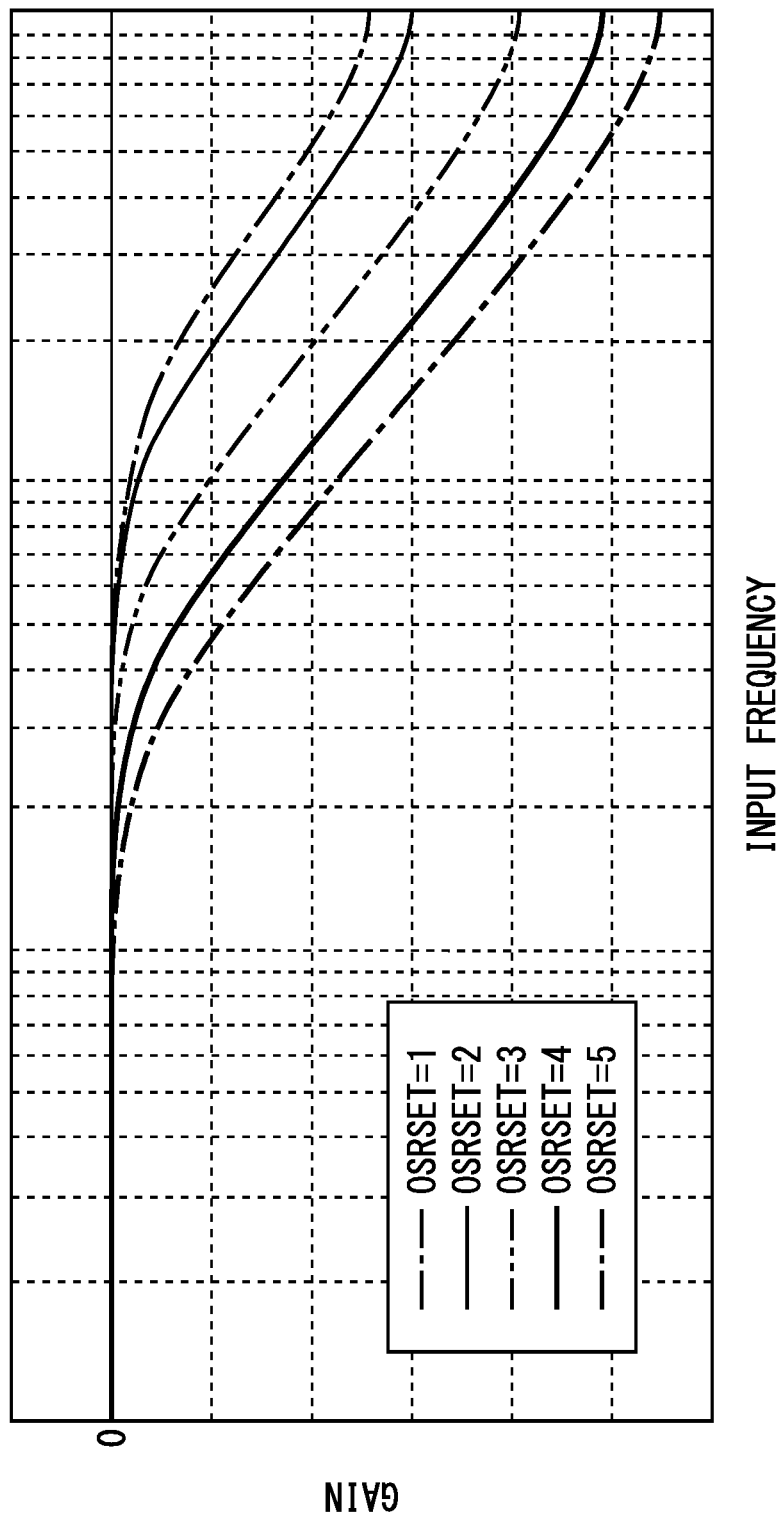
FIG. 5 shows the gain characteristic of the delta-sigma AD converter 10 according to the present embodiment.

FIG. 5 shows the gain characteristic of the delta-sigma AD converter 10 according to the present embodiment. In the present drawing, the horizontal axis indicates the input frequency, and the vertical axis indicates the gain for every input frequency. Here, the gain digitally represents the ratio output to the output signal DOUT for each frequency component of the input analog signal AIN.

Since the delta-sigma AD converter 10 according to the present embodiment does not include a sample/hold circuit for sampling the input analog signal AIN every conversion cycle, the noise suppression effect of suppressing the high frequency component, i.e. the noise component, of the input analog signal AIN is higher than that of a delta-sigma AD converter that includes a sample/hold circuit. Furthermore, as shown in the present drawing, the delta-sigma AD converter 10 can decrease the output rate in exchange for increasing the noise suppression capability, by making the OSR setting value OSRSET larger to increase the OSR.

Since the delta-sigma AD converter 10 according to the present embodiment can change the OSR using the external control signal CSN, it is possible to easily realize various types of filter effects using a single AD converter.

Figure 6:
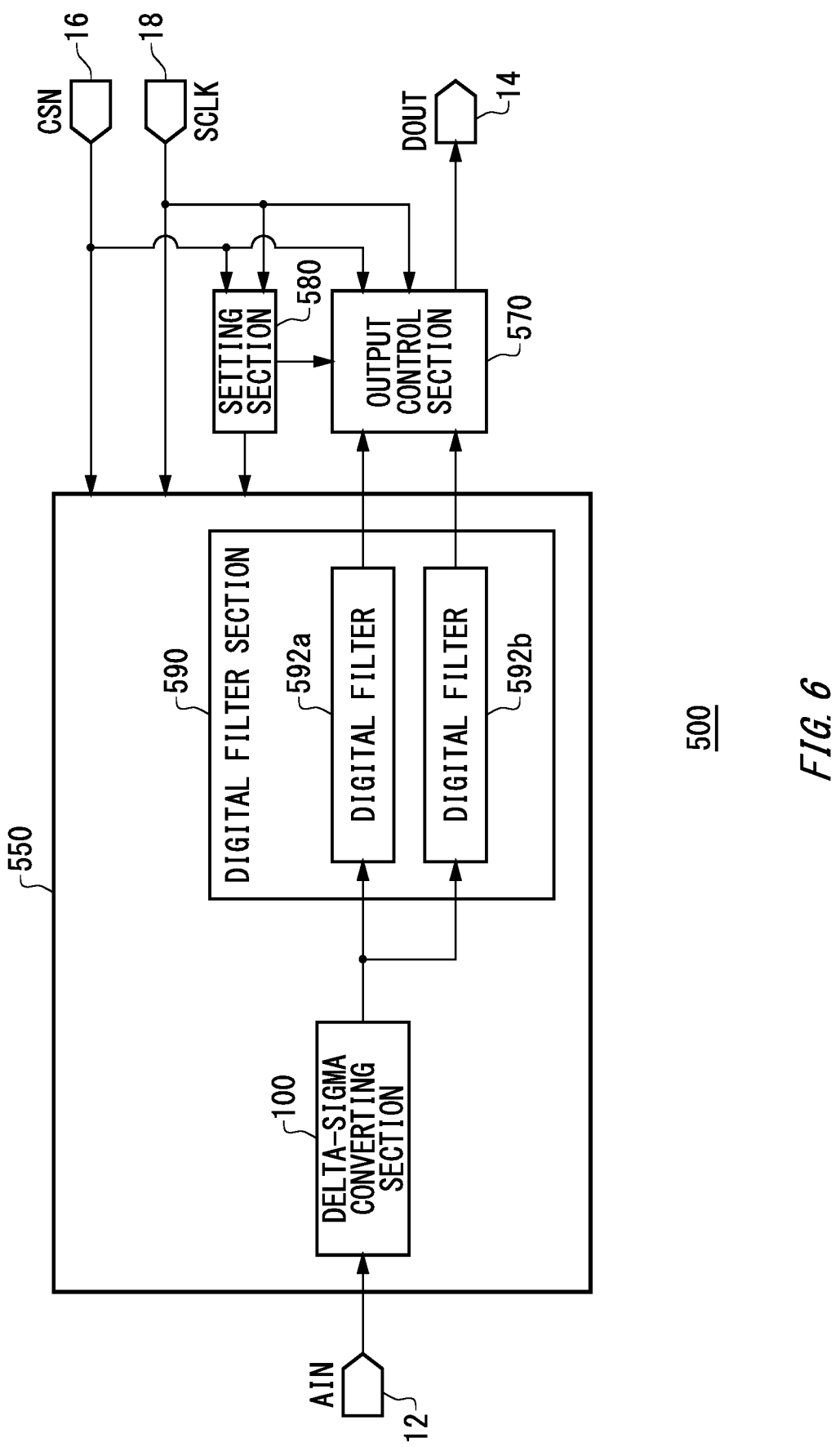
FIG. 6 shows a configuration of a delta-sigma AD converter 500 according to a modification of the present embodiment.

FIG. 6 shows a configuration of a delta-sigma AD converter 500 according to a modification of the present embodiment. In the present drawings, components given the same reference numerals as in FIG. 1 have the same functions and configurations as in FIG. 1, and therefore only differing points are described below.

The delta-sigma AD converter 500 includes the input terminal 12, the output terminal 14, the output control terminal 16, the clock terminal 18, an AD converting section 550, an output control section 570, and a setting section 580. The input terminal 12, the output terminal 14, the output control terminal 16, and the clock terminal 18 are described in relation to FIG. 1.

The AD converting section 550 includes the delta-sigma modulating section 100 and a digital filtering section 590. The delta-sigma modulating section 100 is described in relation to FIG. 1. The digital filtering section 590 includes a plurality of digital filters 592a and 592b (referred to below collectively as the "digital filters 592") corresponding to a plurality of settable OSRs. Each of the plurality of digital filters 592a and 592b includes a set of predetermined filter coefficients for the corresponding OSR, receives the modulated digital signal Y from the delta-sigma modulating section 100, and outputs the digital output ADO[n−1:0] for the corresponding OSR. The other functions and configurations of each of the plurality of digital filters 592a and 592b are the same as those of the digital filtering section 190 of FIG. 1.

The output control section 570 receives the digital output ADO [n−1:0] from each of the plurality of digital filters 592. In the same manner as the output control section 70, the output control section 570 performs control to output the output signal DOUT based on the filtered modulated digital signal Y, in response to the external control signal CSN input thereto. Here, the output control section 570 according to the present modification functions as a multiplexer that sequentially outputs the output signal DOUT corresponding to the OSR sequentially set in the conversion cycle by the setting section 580.

The setting section 580 sequentially sets a number of OSRs that corresponds to the length of the target interval (e.g. an interval during which the external control signal CSN is the second logic value in the conversion cycle), among the plurality of OSRs. Here, the delta-sigma modulating section 100 and the plurality of digital filters 592 in the AD converting section 50 is reset at the start timing of the conversion cycle, and starts generating the digital output ADO [n−1:0] corresponding to each of the plurality of OSRs. The delta-sigma modulating section 100 and the plurality of digital filters 592 sample the input analog signal AIN at a greater number of sampling points when the OSR is higher, and therefore digital output ADO[n−1:0] with a higher OSR is output at a later timing. Therefore, the setting section 580 according to the present modification sequentially selects each OSR in order from the smallest OSR among the plurality of OSRs (i.e. in the order in which the digital output ADO[n−1:0] is obtained) while the target interval continues during the conversion cycle. In this way, every time the digital output ADO[n−1:0] corresponding to an OSR is output while the target interval continues, the output control section 570 can output an output signal corresponding to this OSR.

Figure 7:
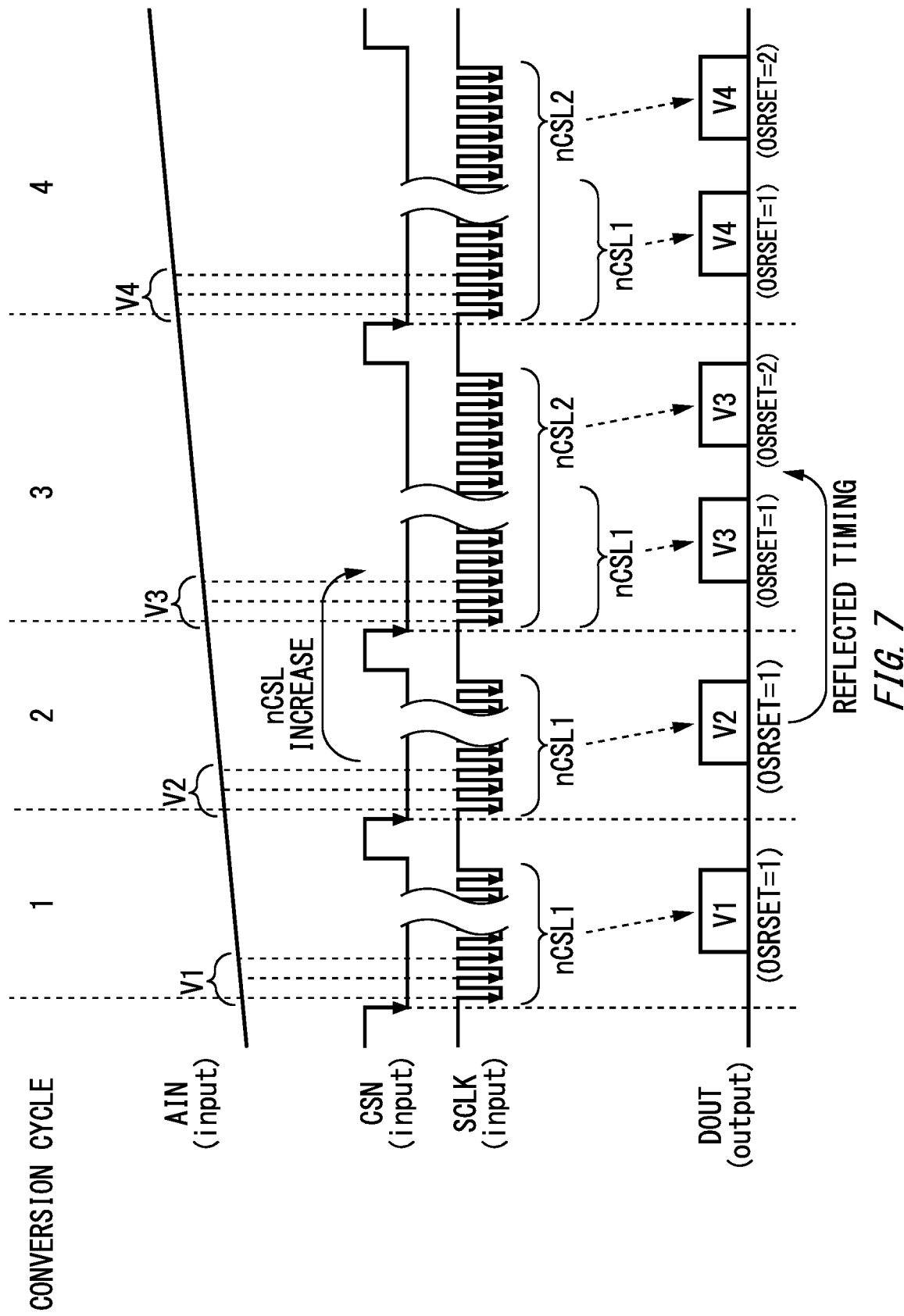
FIG. 7 shows a timing chart of the AD conversion performed by the delta-sigma AD converter 500 according to the modification of the present embodiment.

FIG. 7 shows a timing chart of the AD conversion performed by the delta-sigma AD converter 500 according to the modification of the present embodiment. The timing chart of the present drawing indicates time in the horizontal direction, and indicates the values of the conversion cycle number, the input analog signal AIN, the external control signal CSN, the clock signal SCLK, and the output signal DOUT arranged in the vertical direction. In the timing chart of the present drawing, the delta-sigma AD converter 500 receives an external control signal CSN in which the length of the target interval allows for only one OSR among the plurality of OSRs to be output in cycles 1 and 2, and receives an external control signal CSN in which the length of the target interval allows for two OSRs among the plurality of OSRs to be output in cycles 3 and 4. In the present drawing, descriptions of operations that are the same as in FIG. 4 are omitted, and the following description includes only differing points.

In conversion cycle 1, the setting section 580 first selects the OSR setting value OSRSET=1 corresponding to the smallest OSR among the plurality of settable OSRs. The delta-sigma modulating section 100 samples and integrates the input analog signal AIN (analog value V1) without depending on the set OSR. The plurality of digital filters 592 in the digital filtering section 590 filter the modulated digital signal Y output by the delta-sigma modulating section 100 using the filter coefficients corresponding to the OSR of the corresponding digital filter 592. As an example, the digital filter 592a filters the modulated digital signal using filter coefficients corresponding to the OSR with OSRSET=1, and the digital filter 592b filters the modulated digital signal using filter coefficients corresponding to the OSR with OSRSET=2.

When the digital filter 592a outputs the digital output ADO[n−1:0] corresponding to OSRSET=1, the output control section 570 outputs the output value DOUT (digital value V1) based on this digital output ADO[n−1:0] at the output timing for the OSR corresponding to OSRSET=1, according to the setting of the setting section 580.

In conversion cycle 1, the external control signal CSN rises after nCSL1 cycles from the start timing of the conversion cycle. Therefore, the target interval has a length allowing for the setting of only one OSR, and the setting section 580 ends the OSR setting in the conversion cycle without selecting the next smallest OSR (OSR with OSR-SET=1).

In conversion cycle 2 as well, the external control signal CSN rises after nCSL1 cycles from the start timing of the conversion cycle. Therefore, the delta-sigma AD converter 500 operates in the same manner as in conversion cycle 1.

In conversion cycle 3, the setting section 580 first selects the OSR setting value OSRSET=1 corresponding to the smallest OSR among the plurality of settable OSRs. The delta-sigma modulating section 100 samples and integrates the input analog signal AIN (analog value V3) without depending on the set OSR. In the present drawing, only the sampling range corresponding to OSRSET=1 is shown as V3. The plurality of digital filters 592 in the digital filtering section 590 filter the modulated digital signal output by the delta-sigma modulating section 100, using the filter coefficients corresponding to the OSR of the corresponding digital filter 592. As an example, the digital filter 592a samples the modulated digital signal Y using the filter coefficients corresponding to the OSR with OSRSET=1, and the digital filter 592b filters the modulated digital signal Y using the filter coefficients corresponding to the OSR with OSR-SET=2.

When the digital filter 592a outputs the digital output ADO[n−1:0] corresponding to OSRSET=1, the output control section 570 outputs the output signal DOUT (digital value V3) based on this digital output ADO[n−1:0] at the output timing for the OSR corresponding to OSRSET=1, according to the setting of the setting section 580.

In conversion cycle 3, the external control signal CSN does not rise after nCSL1 cycles from the start timing of the conversion cycle. Therefore, after the output of the output signal DOUT corresponding to OSRSET=1, the setting section 580 selects the OSR setting value OSRSET=2 corresponding to the next smallest OSR among the settable OSRs.

When the digital filter 592b outputs the digital output ADO[n−1:0] corresponding to OSRSET=1, the output control section 570 outputs the output signal DOUT (digital value V3) based on this digital output ADO[n−1:0] at the output timing for the OSR corresponding to OSRSET=2, according to the setting of the setting section 580.

In conversion cycle 3, the external control signal CSN rises after nCSL2 cycles from the start timing of the conversion cycle. Therefore, the target interval has a length allowing for the setting of two OSRs, and the setting section 580 ends the OSR setting in the conversion cycle without selecting the next smallest OSR (OSR with OSRSET=3). Here, in a case where the external control signal CSN does not rise even after nCSL2 cycles from the start timing of the conversion cycle, the delta-sigma AD converter 500 may sequentially set the respective OSRs in the same manner as described above, and output the output signal DOUT corresponding to each OSR.

In conversion cycle 4 as well, the external control signal CSN rises after nCSL2 cycles from the start timing of the conversion cycle. Therefore, the delta-sigma AD converter 500 operates in the same manner as in conversion cycle 3.

According to the delta-sigma AD converter 500 of the modification described above, it is possible to set the OSR in a conversion cycle based on the external control signal CSN in this conversion cycle. Furthermore, according to the delta-sigma AD converter 500, it is possible to output the output signal DOUT corresponding to each of two or more OSRs, according to the length of the target interval in which the external control signal CSN satisfies a predetermined condition.

Various embodiments of the present invention may be described with reference to flowcharts and block diagrams. The flowcharts and block diagrams may (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media.

Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device. In this way, the computer-readable medium having instructions stored therein comprises an article of manufacture including instructions which can be executed to create means for performing operations specified in the flowcharts or block diagrams.

Examples of computer-readable media may include an electronic storage medium, a magnetic storage medium, an optical storage medium, an electromagnetic storage medium, a semiconductor storage medium, and the like. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY(Registered Trademark) disc, a memory stick, an integrated circuit card, and the like.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA®, C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, and the like. In this way, the processor or programmable circuitry of a general use computer, specialized computer, or another programmable data processing apparatus can execute the computer-readable instructions to create means for performing operations specified in the flowcharts or block diagrams. Examples of processors include computer processors, processing units, microprocessors, digital signal processors, controllers, microcontrollers, and the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A delta-sigma AD converter comprising:
a delta-sigma modulating section that outputs a digital signal obtained by performing delta-sigma modulation with an oversampling ratio on an input analog signal;
a digital filtering section that filters the digital signal with the oversampling ratio;
a control terminal into which an external control signal is input;
an output control section that performs control to output an output signal based on the filtered digital signal, according to the external control signal; and
a setting section that sets the oversampling ratio based on interval information of the external control signal.

2. The delta-sigma AD converter according to claim 1, wherein
the setting section changes a filter coefficient of the digital filtering section, according to the set oversampling ratio.

3. The delta-sigma AD converter according to claim 1, wherein
the delta-sigma modulating section includes an analog integrating section that integrates a signal that is based on the input analog signal, and
the setting section changes the number of times the analog integrating section performs the integration, according to the set oversampling ratio.

4. The delta-sigma AD converter according to claim 1, wherein
the external control signal designates a start timing of a conversion cycle by changing from a first logic value to a second logic value, and
the setting section sets the oversampling ratio based on a length of a target interval that is an interval during which the external control signal is the first logic value, an interval during which the external control signal is the second logic value, or a total interval that includes the interval during which the external control signal is the first logic value and the interval during which the external control signal is the second logic value.

5. The delta-sigma AD converter according to claim 4, wherein
the output control section outputs the output signal at a timing corresponding to a clock signal input thereto, and
the setting section sets the oversampling ratio based on the number of clock pulses of the clock signal in the target interval.

6. The delta-sigma AD converter according to claim 4, wherein
the setting section sets the oversampling ratio of a following conversion cycle based on the external control signal.

7. The delta-sigma AD converter according to claim 4, wherein
the setting section sequentially sets a number of oversampling ratios that corresponds to the length of the target interval, among a plurality of oversampling ratios, in the conversion cycle, and
the output control section sequentially outputs the output signal corresponding to the sequentially set oversampling ratios in the conversion cycle.

8. The delta-sigma AD converter according to claim 1, wherein
the delta-sigma modulating section includes:
an analog integrating section that integrates a signal that is based on the input analog signal;
a quantizing section that quantizes an output signal of the analog integrating section;
a DA converting section that generates a feedback signal based on output of the quantizing section; and
an adding section that adds the feedback signal from the DA converting section to the input analog signal, and
the analog integrating section integrates output of the adding section.

9. The delta-sigma AD converter according to claim 8, wherein
the delta-sigma modulating section further includes a resetting section that resets an integrated value held by the analog integrating section every conversion cycle.

10. The delta-sigma AD converter according to claim 1, wherein
the control terminal is an input terminal for a chip select signal of an SPI (Serial Peripheral Interface).

11. A delta-sigma AD converting method comprising:
outputting, by a delta-sigma AD converter, a digital signal obtained by performing delta-sigma modulation with an oversampling ratio on an input analog signal;
filtering, by the delta-sigma AD converter, the digital signal with the oversampling ratio;
performing control, by the delta-sigma AD converter, to output an output signal based on the filtered digital signal, according to an external control signal input from a control terminal; and
setting, by the delta-sigma AD converter, the oversampling ratio based on interval information of the external control signal.

12. The delta-sigma AD converter according to claim 1, wherein
the setting section instructs the delta-sigma modulating section and the digital filtering section to operate with the oversampling ratio set by the setting section.

* * * * *